(12) United States Patent
Fujishima et al.

(10) Patent No.: US 12,094,809 B2
(45) Date of Patent: Sep. 17, 2024

(54) CHIP-MIDDLE TYPE FAN-OUT PANEL-LEVEL PACKAGE AND PACKAGING METHOD THEREOF

(71) Applicant: Powertech Technology Inc., Hukou Township, Hsinchu County (TW)

(72) Inventors: Hiroyuki Fujishima, Hukou Township, Hsinchu County (TW); Shang-Yu Chang-Chien, Hukou Township, Hsinchu County (TW)

(73) Assignee: Powertech Technology Inc., Hukou Township (TW)

( * ) Notice: Subject to any disclaimer, the term of this patent is extended or adjusted under 35 U.S.C. 154(b) by 323 days.

(21) Appl. No.: 17/562,211

(22) Filed: Dec. 27, 2021

(65) Prior Publication Data

US 2023/0207434 A1 Jun. 29, 2023

(51) Int. Cl.

| H01L 23/498 | (2006.01) |
|---|---|
| H01L 21/48 | (2006.01) |
| H01L 21/56 | (2006.01) |
| H01L 23/00 | (2006.01) |
| H01L 23/31 | (2006.01) |
| H01L 25/00 | (2006.01) |
| H01L 25/065 | (2023.01) |

(52) U.S. Cl.
CPC .... *H01L 23/49816* (2013.01); *H01L 21/4853* (2013.01); *H01L 21/561* (2013.01); *H01L 23/3128* (2013.01); *H01L 23/49822* (2013.01); *H01L 23/49838* (2013.01); *H01L 24/73* (2013.01); *H01L 24/97* (2013.01); *H01L 25/0657* (2013.01); *H01L 25/50* (2013.01); *H01L 2224/29* (2013.01); *H01L 2224/73253* (2013.01); *H01L 2225/06506* (2013.01); *H01L 2225/0651* (2013.01); *H01L 2225/06562* (2013.01)

(58) Field of Classification Search
CPC .......... H01L 23/49816; H01L 23/3128; H01L 23/49822; H01L 23/49838; H01L 21/4853; H01L 21/561; H01L 24/73; H01L 24/97; H01L 25/0657; H01L 25/50; H01L 2224/29; H01L 2224/7325; H01L 2225/06506; H01L 2225/0651; H01L 2225/06562
USPC ....................................... 257/668
See application file for complete search history.

(56) References Cited

U.S. PATENT DOCUMENTS

2020/0357770 A1* 11/2020 Chiang ................. H01L 24/49

FOREIGN PATENT DOCUMENTS

| CN | 111403368 A | 7/2020 |
|---|---|---|
| TW | 202042353 A | 11/2020 |

* cited by examiner

*Primary Examiner* — Jasmine J Clark
(74) *Attorney, Agent, or Firm* — patenttm.us

(57) ABSTRACT

A chip-middle type fan-out panel-level package (FOPLP) has a routing layer, a polyimide layer formed on the routing layer and having a plurality of pillar openings and a chip opening, a plurality of metal pillars mounted on the routing layer through the corresponding pillar openings, a chip mounted on the first routing layer through the chip opening and a molding compound formed on the polyimide layer to encapsulate the metal pillars and the chip. The polyimide layer is used to control the warpage of the FOPLP. The polyimide layer is formed inside the FOPLP and the chip is directly mounted on the first routing layer through the chip opening, so a height of the FOPLP is not increased when the first PI layer is added.

7 Claims, 13 Drawing Sheets

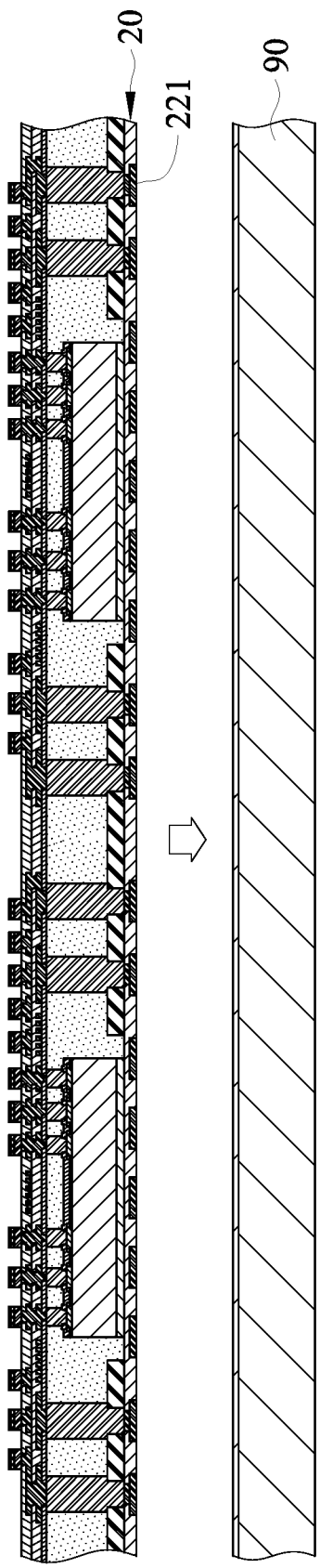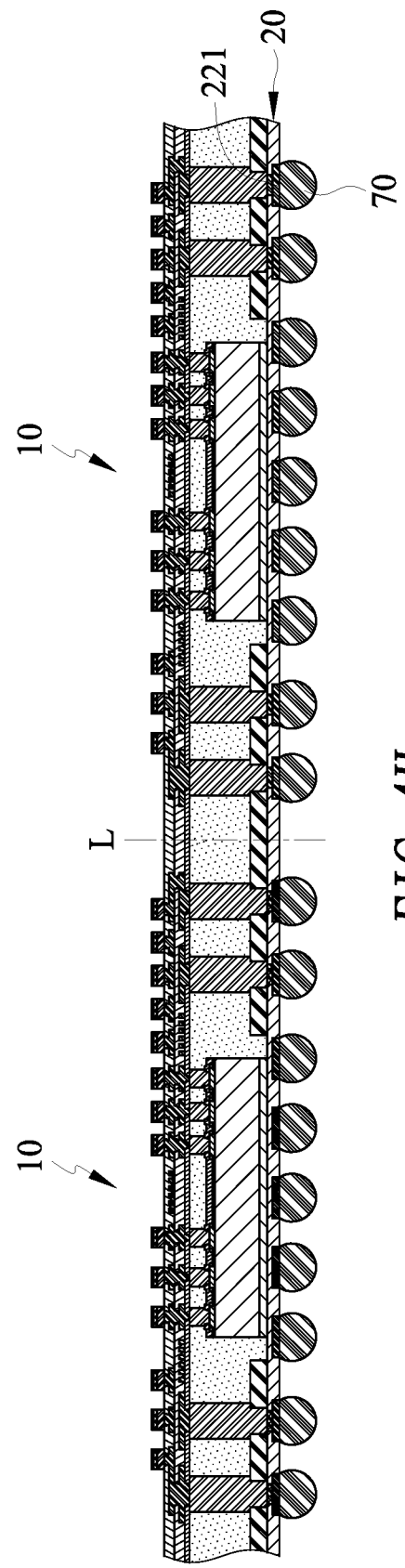
FIG. 4G
FIG. 4H

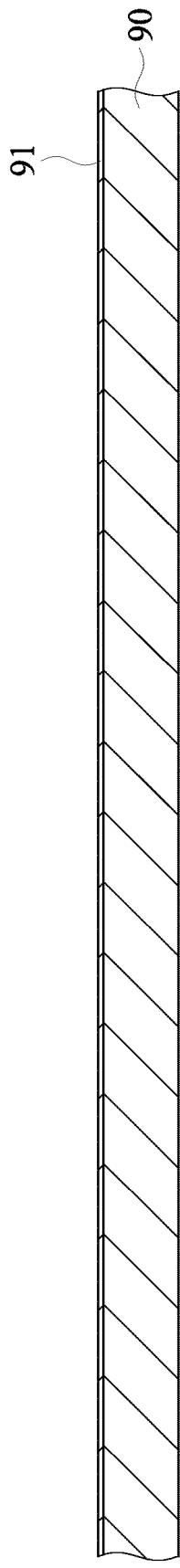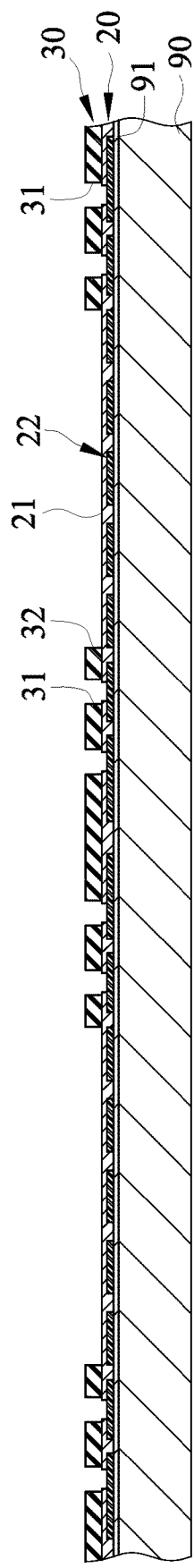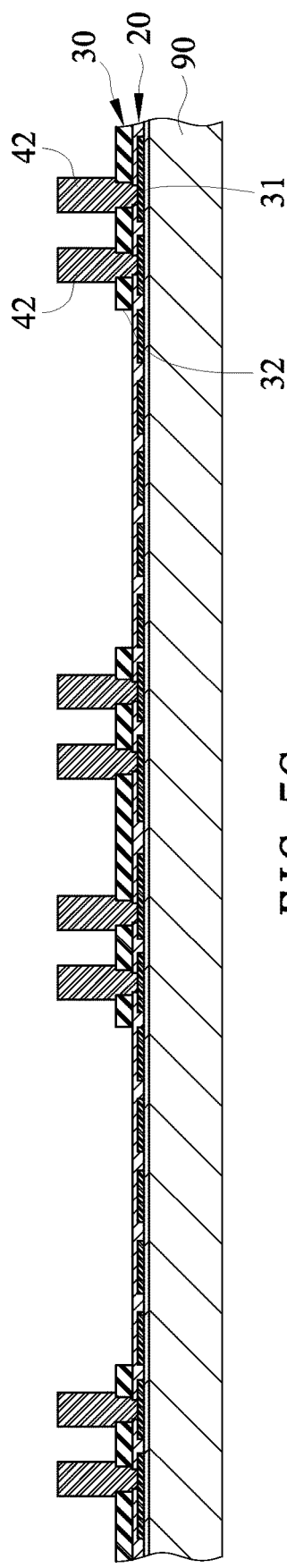

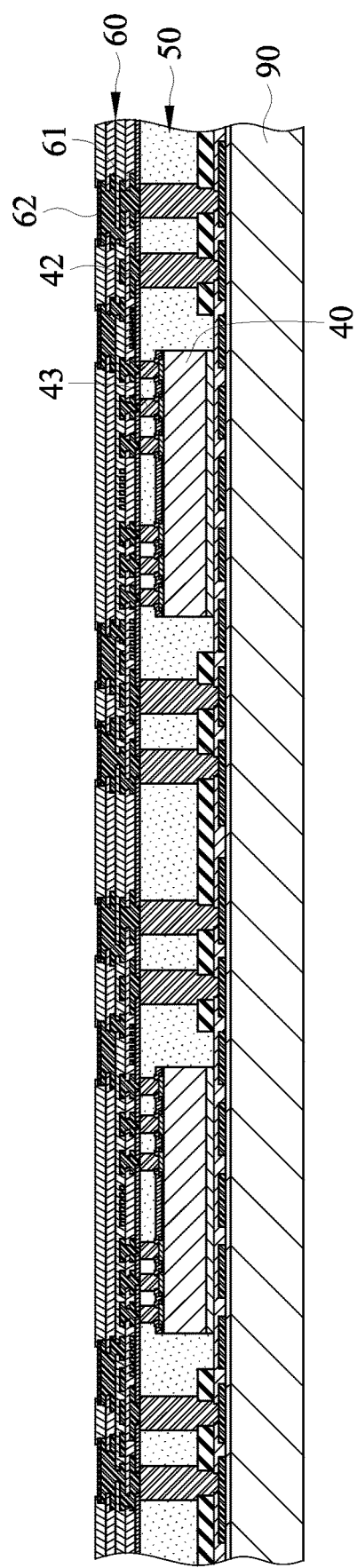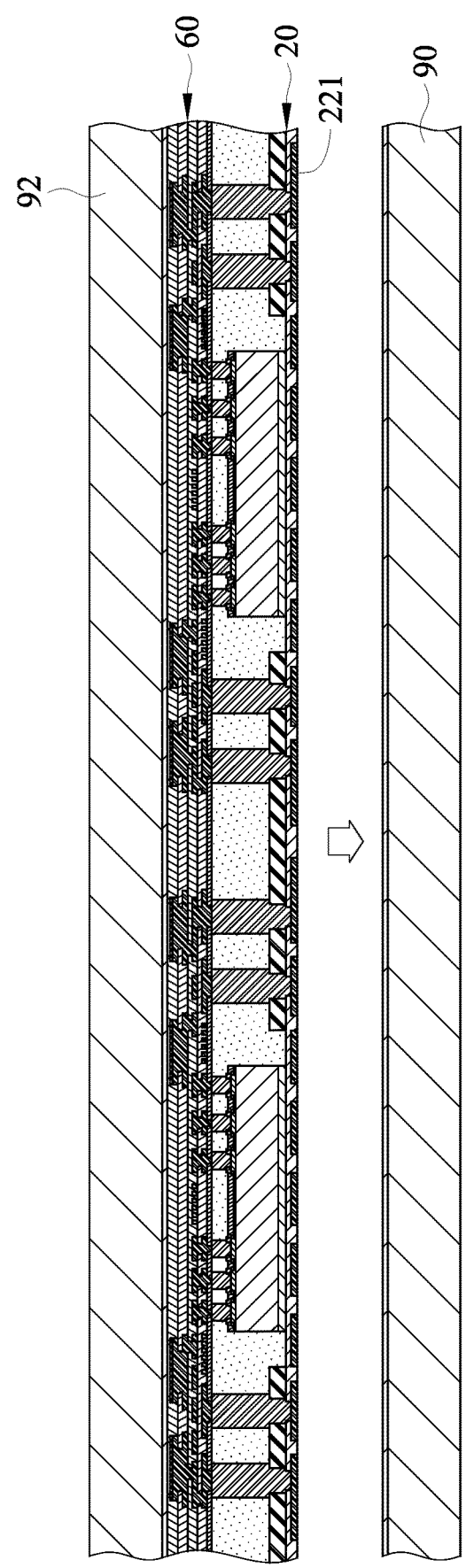

CHIP-MIDDLE TYPE FAN-OUT PANEL-LEVEL PACKAGE AND PACKAGING METHOD THEREOF

BACKGROUND OF THE INVENTION

1. Field of the Invention

The present invention is related to a fan-out panel-level package (FOPLP), and more particularly to a chip-middle type FOPLP and a packaging method thereof.

2. Description of the Prior Arts

With reference to FIGS. 6 and 7, two different chip-middle type fan-out panel-level packages 93, 93' (hereinafter FOPLP) are shown. The chip-middle type FOPLP of FIG. 6 has an upper routing layer 931, a lower routing layer 932, a molding compound layer 933 and a plurality of chips 94. The chips 94 are encapsulated in the molding compound layer 933. The chips 94 and the molding compound layer 933 are sandwiched between the upper and lower routing layers 931, 932. Therefore, the chips 94 are located at a middle position of the FOPLP 93.

As shown in FIG. 6, an active surface 941 of each chip 94 faces downwardly and electrically connected to the lower routing layer 932, so a layer count of the lower routing layer 932 (such as 5P4M redistribution layer) is more than that of the upper routing layer 931 (such as 2P1M redistribution layer). Therefore, a shrinkage force F1 of the lower routing layer 932 is larger than a shrinkage force F2 of the upper routing layer 931 and the chip-middle type FOPLP 93 is bent downwardly. On the contrary, as shown in FIG. 7, the active surface 941 of each chip 94 faces upwardly and electrically connected to the upper routing layer 931, so a layer count of the upper routing layer 931 (such as 3P2M redistribution layer) is more than that of the lower routing layer 932 (such as 1P1M redistribution layer). Therefore, a shrinkage force F2 of the upper routing layer is more significant than a shrinkage force F1 of the lower routing layer 932 and the chip-middle type FOPLP 93' is bent upwardly.

As mentioned above, the chip-middle type FOPLP has a warpage problem due to the difference layer count between the upper routing layer and the lower routing layer. If a height of the chip-middle type FOPLP is fixed, the warpage problem is not overcome by adding layers on the routing layer with fewer layers.

To overcome the shortcomings, the present invention provides a chip-middle type FOPLP and a packaging method thereof to mitigate or to obviate the aforementioned problems.

SUMMARY OF THE INVENTION

An objective of the present invention is to provide a chip-middle type fan-out panel-level package (hereinafter FOPLP).

To achieve the objective as mentioned above, the chip-middle type FOPLP has:
 a first routing layer;
 a first polyimide (PI) layer formed on the first routing layer and having:
  a chip opening; and
  a plurality of pillar openings;
 a plurality of metal pillars respectively formed on the first routing layer through the pillar openings;
 a chip mounted on the first routing layer through the chip opening and having:
  an active surface;
  a rear surface opposite to the active surface;
  a plurality of metal bumps formed on the active surface; and
  an adhesive film formed between the rear surface and the first routing layer;
 a molding compound formed on the first PI layer to encapsulate the metal pillars and the chip; and
 a second routing layer formed on the molding compound and electrically connected to the metal pillars and the metal bumps of the chip, wherein a layer count of the second routing layer is larger than that the first routing layer.

With the foregoing description, the first PI layer is used to control the warpage of the FOPLP. The first PI layer is formed inside the FOPLP and the chip is directly mounted on the first routing layer through the chip opening, so a height of the FOPLP is not increased when the first PI layer is added.

To achieve the objective as mentioned above, the packaging method of chip-middle type FOPLP has steps of:
 (a) forming a first routing layer on a first carrier;
 (b) forming a first polyimide (PI) layer on the first routing layer;
 (c) defining a plurality of chip openings and a plurality of pillar openings through the IP layer;
 (d) forming a plurality of metal pillars on the first routing layer through the pillar openings and electrically connected to the first routing layer;
 (e) mounting a plurality of chips on the first routing layer through the chip openings; wherein a rear surface of each chip is mounted on the first routing layer by an adhesive film and an active surface of each chip has a plurality of metal bumps electrically connected to the first routing layer;
 (f) forming a molding compound on the first PI layer to encapsulate the metal pillars and the chips;
 (g) grinding the molding compound to expose the metal pillars and the metal bumps of each chip;
 (h) forming a second routing layer on the molding compound to electrically connect to the metal pillars and the chips; and
 (i) executing a dicing step to separate a plurality of chip-middle type FOPLPs.

With the foregoing description, the first PI layer is formed on the first routing layer before the chips are mounted thereon, so the first PI layer is formed inside the FOPLP to control the warpage of the FOPLP. Furthermore, since the chips are still directly mounted on the first routing layer through the chip openings of the first PI layer, a height of the FOPLP is not increased when the first PI layer is added.

Other objectives, advantages and novel features of the invention will become more apparent from the following detailed description when taken in conjunction with the accompanying drawings.

BRIEF DESCRIPTION OF THE DRAWINGS

FIGS. 4A to 4H are cross sectional views in different steps of a first embodiment of a packaging method in accordance with the present invention;

FIGS. 5A to 5J are cross sectional views in different steps of a third embodiment of a packaging method in accordance with the present invention;

DETAILED DESCRIPTION OF THE PREFERRED EMBODIMENTS

With multiple embodiments and drawings thereof, the features of the present invention are described in detail as follows.

Figure 1:
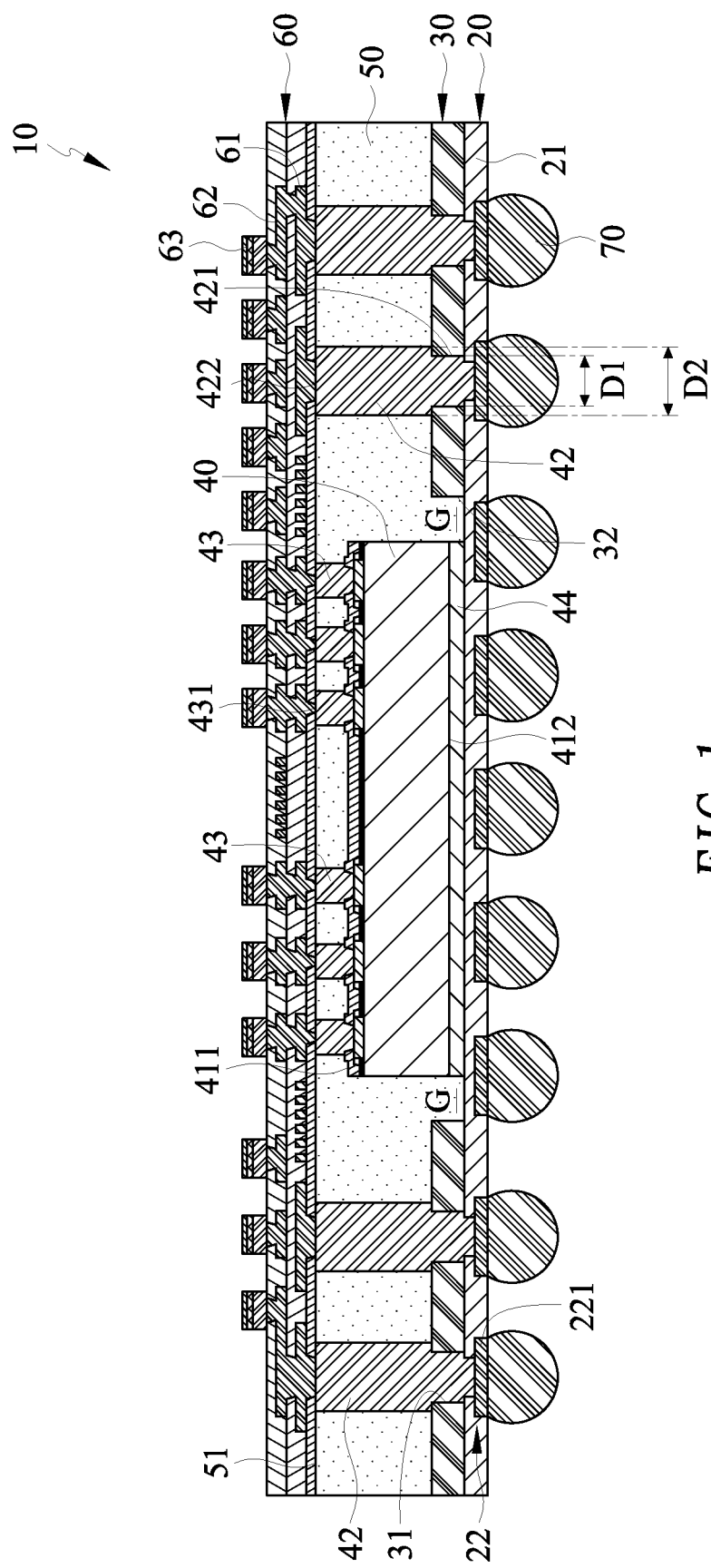
FIG. 1 is a cross sectional view of a first embodiment of a chip-middle type fan-out panel-level package (hereinafter FOPLP) in accordance with the present invention.

With reference to FIG. 1, a first embodiment of a chip-middle type fan-out panel-level package (hereinafter FOPLP) is shown. The chip-middle type FOPLP 10 has a first routing layer 20, a first polyimide (PI) layer 30, a plurality of metal pillars 42, a chip 40, the first molding compound layer 50 and a second routing layer 60.

The first routing layer 20 may be a redistribution layer. In the present embodiment, the first routing layer 20 may be a 1P1M redistribution layer (RDL), as shown in FIG. 1 and has one polyimide lamination 21 and one metal layer 22. The metal layer 22 has a plurality of metal pads 221 on which a plurality of solder balls 70 are respectively mounted.

The first PI layer 30 is formed on the first routing layer 20. A plurality of pillar openings 31 are defined through the first PI layer 30 to expose the metal pads 221 of the first routing layer 20. A first chip opening 32 is defined through the first PI layer 30. In the present embodiment, the first chip opening 32 is surrounded by the pillar openings 31.

The metal pillars 42 are formed on the first routing layer 20 through the pillar openings 31 and electrically connected to the metal layer 22 of the first routing layer 20. In the present embodiment, each metal pillar 42 has a protruding end 421 and a flat end 422. In the present embodiment, the protruding end 421 is directly connected to the exposed metal pad 221. The protruding end 421 has a first diameter D1 is smaller than a second diameter D2 of the flat end 422. The first diameter D1 of the protruding end 421 matches a diameter D1 of the corresponding pillar opening 31 of the first PI layer 30.

The chip 40 is mounted on the first routing layer 20 through the first chip opening 32 of the first PI layer 30. In the present embodiment, the chip 40 has an active surface 411 and a rear surface 412. A plurality of metal bumps 43 are formed on the active surface 411 and an adhesive film 44 is formed on the rear surface 412. The rear surface 412 of the chip 40 is mounted on the first routing layer 20 through the adhesive film 44, so the adhesive film 44 is positioned between the rear surface 412 of the chip 40 and the first routing layer 20. The chip 40 is smaller than the first chip opening 32, so a gap G is between the chip 40 and the first PI layer 30. A free end 431 of each metal bump 43 is coplanar with the flat ends 422 of the metal pillars 42.

The first molding compound layer 50 is formed on the first PI layer 30 to encapsulate the metal pillars 42, the chip 40 and the metal bumps 43 thereon, but not to encapsulate the free ends 431 of the metal bumps 43 and the flat ends of the metal pillars 42. A flat surface 51 of the first molding compound layer 50 is coplanar with the free ends 431 of the metal bumps 43 and the flat ends 422 of the metal pillars 42. In the present embodiment, the molding compound layer 50 is also filled in the gap G.

The second routing layer 60 is formed on the molding compound layer 50. In detail, the second routing layer 60 is formed on the flat surface 51 of the first molding compound layer 50, the free ends 431 of the metal bumps 43 and the flat ends 422 of the metal pillars 42. In the present embodiment, the second routing layer 60 may be a redistribution layer, such as the 3P2M redistribution layer. One of the metal layers 61 of the second routing layer 60 close to the molding compound layer 50 is directly connected to the metal bumps 43 and metal pillars 42, so the second routing layer 60 is electrically connected to the metal bumps 43 and the metal pillars 42. A plurality of outer bumps 63 may be further formed on the second routing layer 60 and connected to one of the metal layers 62 of the second routing layer 60 departed away from the first molding compound layer 50.

Figure 2:
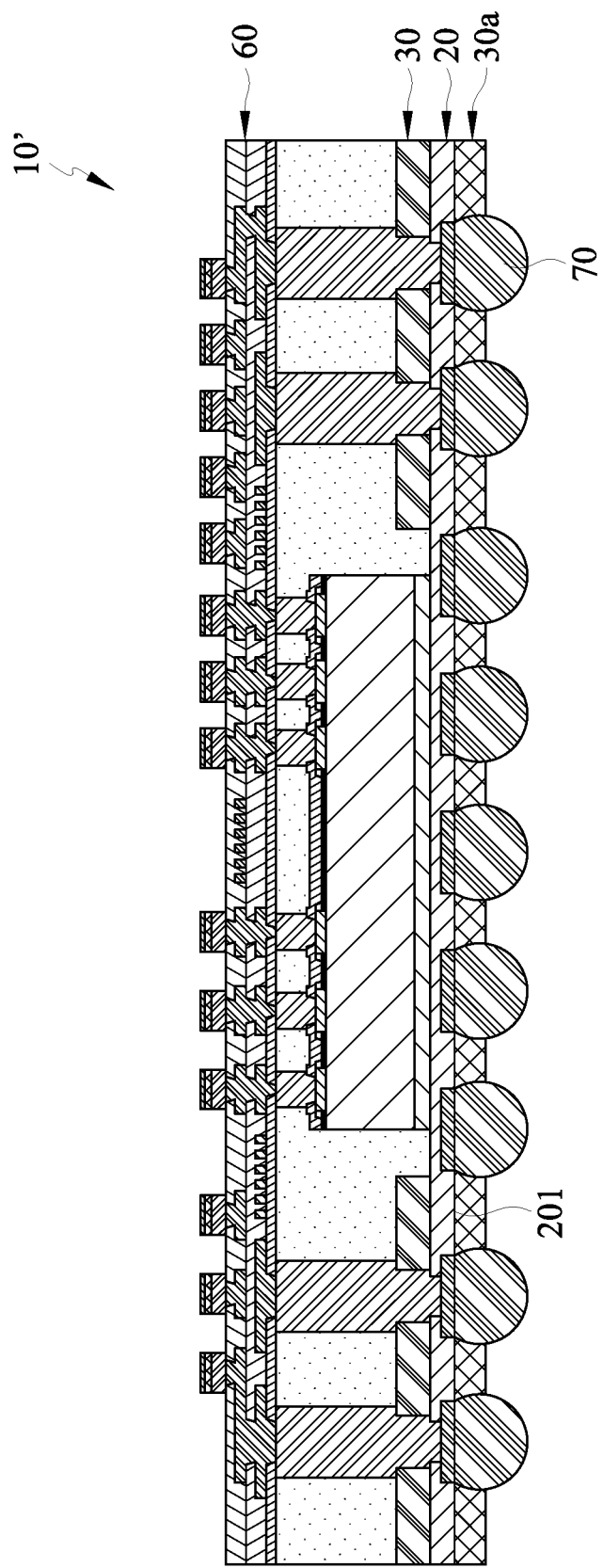
FIG. 2 is a cross sectional view of a second embodiment of a chip-middle type FOPLP in accordance with the present invention.

With further reference to FIG. 2, a second embodiment of a chip-middle type FOPLP 10' is shown and is similar to the chip-middle type FOPLP 10 of FIG. 1. In the second embodiment, the chip-middle type FOPLP 10' further has a second PI layer 30a formed on a bottom 201 of the first routing layer 20. The first routing layer 20 is positioned between the first PI layer 30 and the second PI layer 30a. A thickness of the second PI layer 30a is less than a height of each solder ball 70. In the second embodiment, the first and second PI layers 30, 30a are used to control the warpage of the chip-middle type FOPLP 10'.

Figure 3:
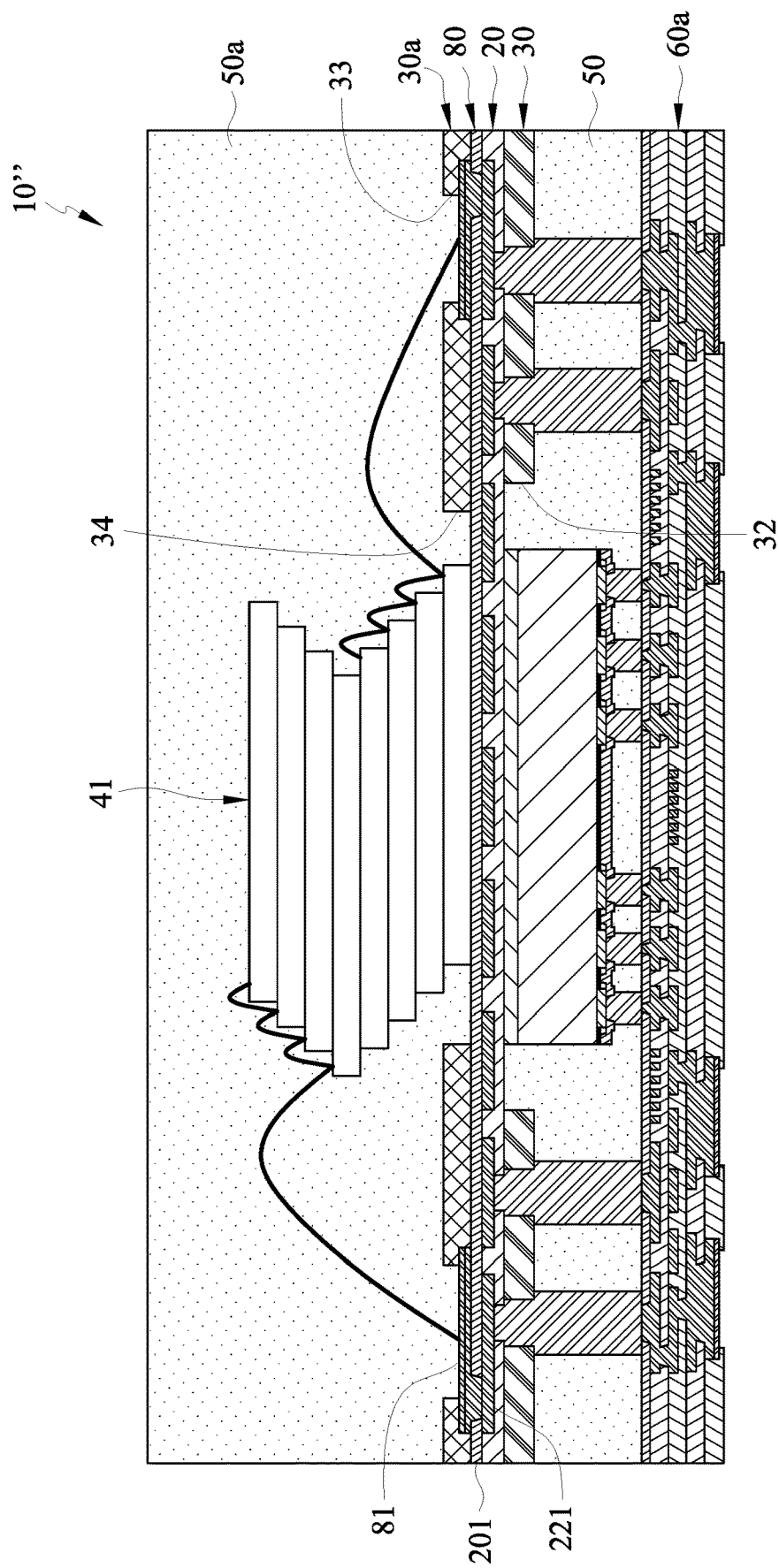
FIG. 3 is a cross sectional view of a third embodiment of a chip-middle type FOPLP in accordance with the present invention.

With further reference to FIG. 3, a third embodiment of a chip-middle type FOPLP 10" is shown and is similar to the chip-middle type FOPLP 10' of FIG. 2. In the third embodiment, the chip-middle type FOPLP 10" does not have the solder balls 70 of FIG. 2 formed on the first routing layer 20, so the metal pads 221 of the first routing layer 20 are exposed from the bottom 201 of the first routing layer 20. In the third embodiment, the chip-middle type FOPLP 10" further has a third routing layer 80 formed on the bottom 201 of the first routing layer 20 to electrically connect to the metal pads 221 of the first routing layer 20. The third routing layer 80 has a plurality of wiring pads 81. A second PI layer 30a is formed on the third routing layer 80. A plurality of pad openings 33 and a second chip opening 34 are defined through the second PI layer 30a. The second chip opening 34 corresponds to the first chip opening 32 of the first PI layer 30. A chip stack 41 is mounted on the third routing layer 80 through the second chip opening 34 of the second PI layer 30a and wired to the wiring pads 81 of the third routing layer 80 through the pad openings 33. A second molding compound layer 50a is formed on the second PI layer 30a to encapsulate the chip stack 41.

With reference to FIGS. 4A to 4H, a fabricating method of the first embodiment of the chip-middle type FOPLP is shown and has steps of (a) to (i) as follows.

Figure 4A:
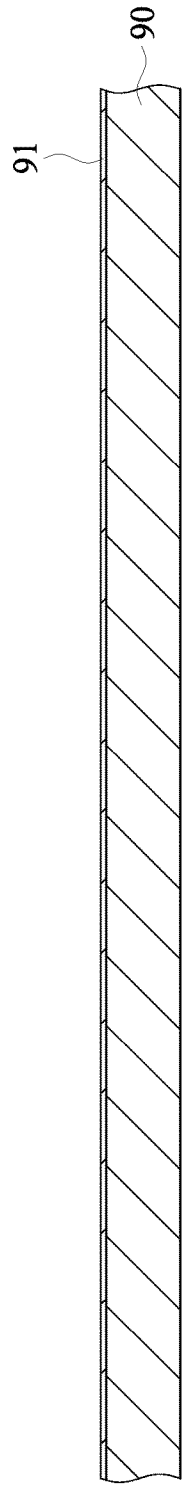
Figure 4B:
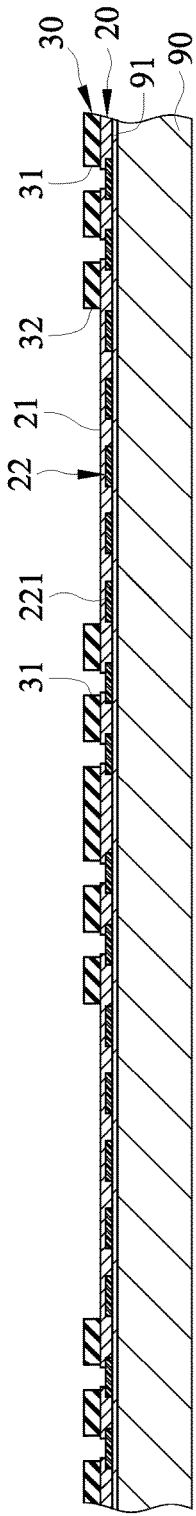

In the step (a), as shown in FIGS. 4A and 4B, a first carrier 90 is prepared and then a first routing layer 20 is formed on a first carrier 90. In the present embodiment, an adhesive layer 91 is formed on the first carrier 90 and the first routing layer 20 is formed on the adhesive layer 91. In the present embodiment, the first routing layer 20 is a 1P1M redistribution layer having one polyimide lamination 21 and one metal layer 22. The metal layer 22 is formed on the adhesive layer 91 and has a plurality of metal pads 221. The polyimide lamination 21 is formed on the metal layer 22. A part of metal pads are exposed from the polyimide lamination 21.

In the step (b), as shown in FIG. 4B, a first PI layer 30 is formed on the first routing layer 20. In the present embodiment, the first PI layer 30 is formed on the polyimide lamination 21 of the first routing layer 20.

In the step (c), as shown in FIG. 4B, a plurality of pillar openings 31 corresponding to the exposed parts of the metal layer 221 are defined through the first PI layer 30. A plurality of first chip opening 32 are defined through the first PI layer 30. Each of the first chip opening 32 are surrounded by the corresponding pillar openings 31.

Figure 4C:
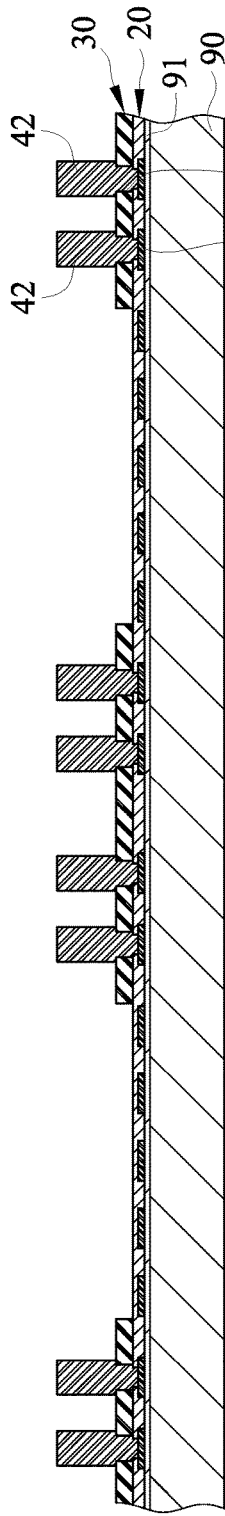

In the step (d), as shown in FIG. 4C, a plurality of metal pillars 42 are formed on the first routing layer 20 through the pillar openings 31 and electrically connected to the first routing layer 20. In the present embodiment, one end of each metal pillar 42 is directly formed on the corresponding exposed part of the metal layer 221, so the metal pillars 42 are electrically connected to the first routing layer 20. Since a diameter of each pillar 42 is larger than a diameter of each pillar opening 31, the end of the metal pillar 42 in the pillar opening 31 has a diameter, which is smaller than that of the metal pillar 42.

Figure 4D:
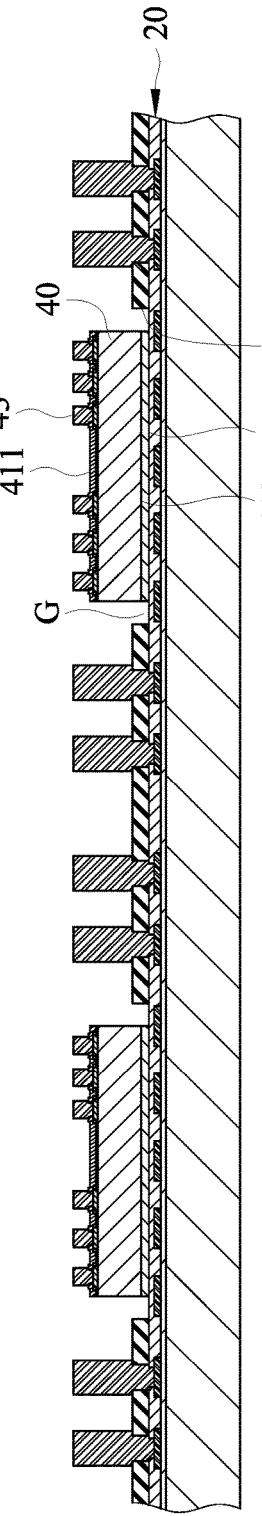

In the step (e), as shown in FIGS. 4C and 4D, a plurality of chips 40 are mounted on the first routing layer 20 through the first chip openings 32. In the present embodiment, a rear surface 412 of each chip 40 is mounted on the first routing layer 20 by an adhesive film 44 and an active surface 411 of each chip 40 has a plurality of metal bumps 43. Each chip 40 is smaller than each first chip opening 32, so a plurality of gaps G are respectively defined between the chips 40 and the first PI layer 30.

Figure 4E:
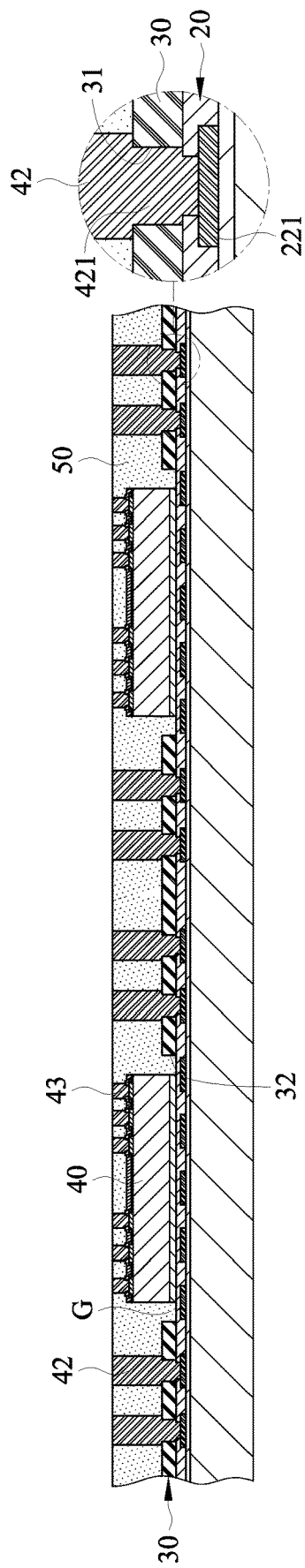

In the step (f), as shown in FIG. 4E, the first molding compound layer is formed on the first PI layer 30 to encapsulate the metal pillars 42, the chips 40 and the metal bumps 43. The molding compound layer 50 is also filled in the gaps G at the same time.

In the step (g), as shown in FIG. 4E, the first molding compound layer 50 is grinded to expose the metal pillars 42 and the metal bumps 43 of each chip 40.

Figure 4F:
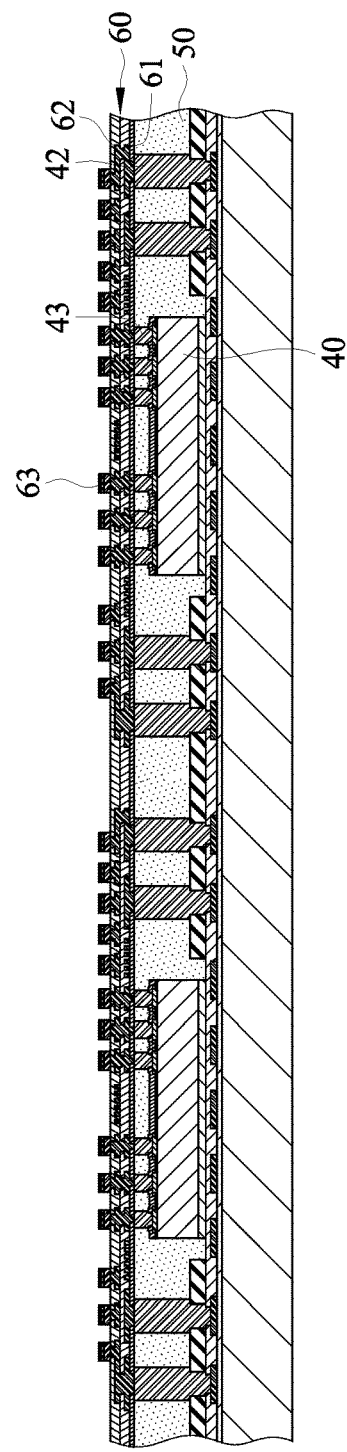

In the step (h), as shown in FIG. 4F, a second routing layer 60 is formed on the first molding compound layer 50 to electrically connect to the metal pillars 42 and the metal bumps 43 of the chips 40. In the present embodiment, the second routing layer 60 is a 3P2M redistribution layer having three polyimide laminations and two metal layers 61, 62 alternately and sequentially formed on the first molding compound layer 50. One of the metal layers 62 close to the molding compound layer 50 is connected to the exposed metal pillars 42 and metal bumps 43. A plurality of outer bumps 63 are formed on the second routing layer 60 and connected to one of the metal layers 62 departed away from the first molding compound layer 50. After then, as shown in FIG. 4G, the first carrier 90 is removed from the first routing layer 20 to expose the metal pads 221. With further reference to FIG. 4H, a plurality of solder balls 70 are respectively mounted on the metal pads 221 of the first routing layer 20. In another embodiment, to fabricate the FOPLP 10' of FIG. 2, a second PI layer 30a may be formed on the first routing layer 20 but not cover the exposed metal pads 221 of the first routing layer 20. And then the solder balls 70 are mounted on the corresponding metal pads 221 through the second PI layer 30a.

In the step (i), as shown in FIG. 4H, a dicing step is executed along scribe lines L to separate a plurality of chip-middle type FOPLPs of FIG. 1.

With reference to FIGS. 5A to 5J, a fabricating method of the third embodiment of the chip-middle type FOPLP 10" is shown and has steps of (a) to (m). As shown in FIGS. 5A to 5E, the steps (a) to (g) of the present fabricating method are the same as steps (a) to (g) of FIGS. 4A to 4E.

In the step (h), as shown in FIG. 5F, a second routing layer 60 is also formed on the first molding compound layer 50, but no outer bumps 63 of FIG. 4F are formed on the second routing layer 60.

In the step (I), as shown in FIG. 5G, the second routing layer 60 is attached to a second carrier 92 and the first carrier 90 is removed to expose the first routing layer 20. The metal pads 221 of the first routing layer 20 are exposed.

Figure 5D:
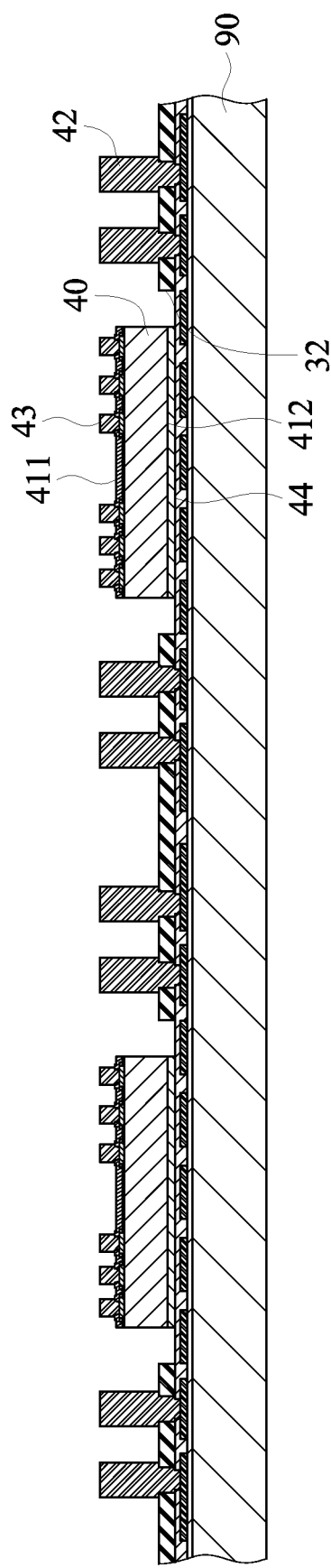
Figure 5E:
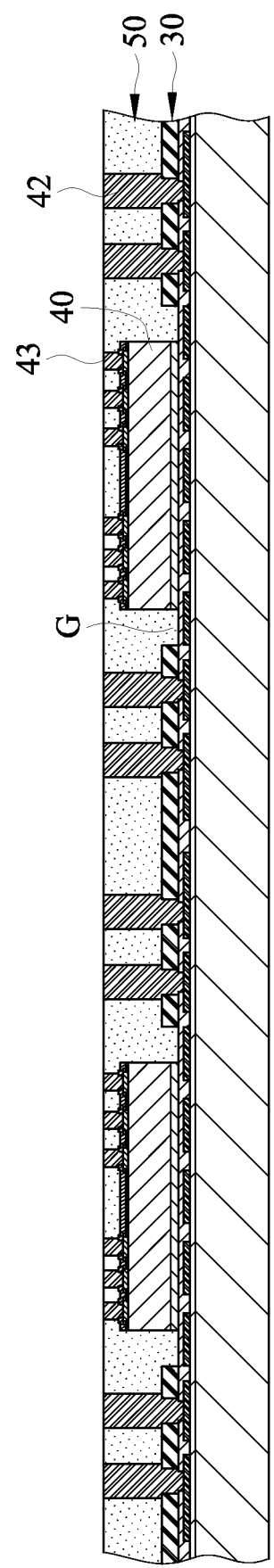
Figure 5H:
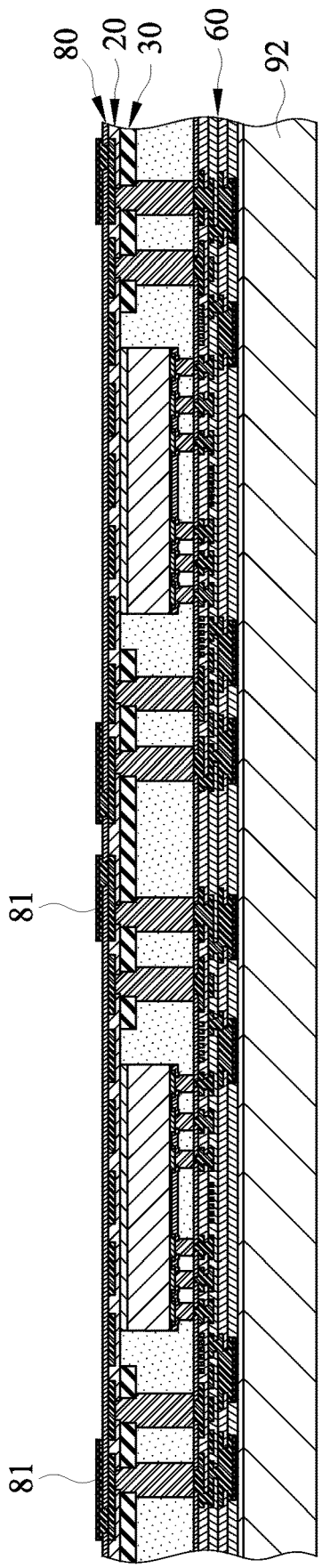
Figure 5I:
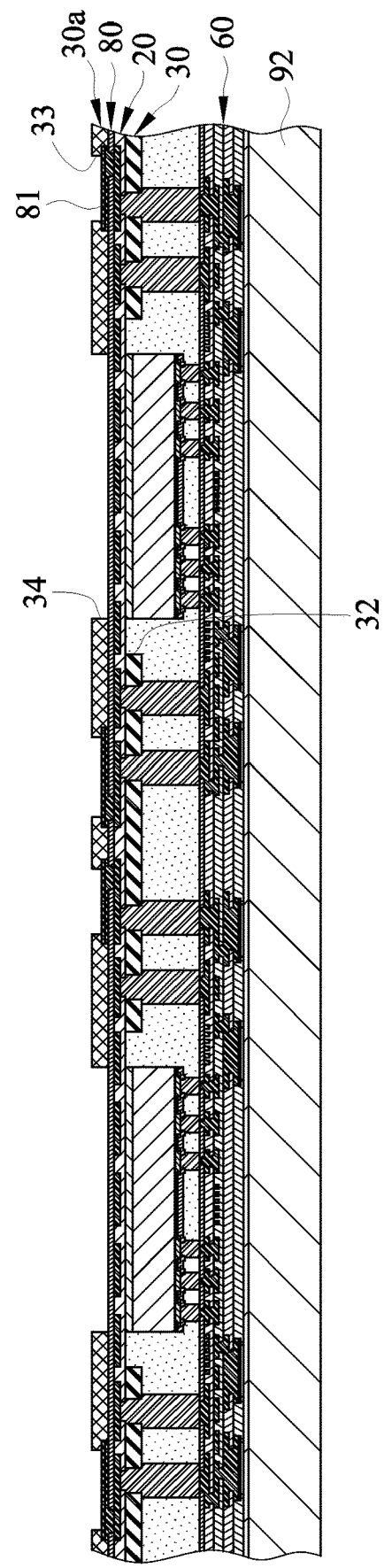

In the step (j), as shown in FIGS. 5H and 5I, a third routing layer 80 is formed on the exposed first routing layer 20 and has a plurality of wiring pads 81. And then, a second polyimide (PI) layer 30a is formed on the third routing layer 80. A plurality of pad openings 33 are defined through the second PI layer 30a to expose the wiring pads 81. A plurality of second chip openings 34 corresponding to the first chip openings 32 of the first PI layer 30 are defined through the second PI layer 30a.

Figure 5J:
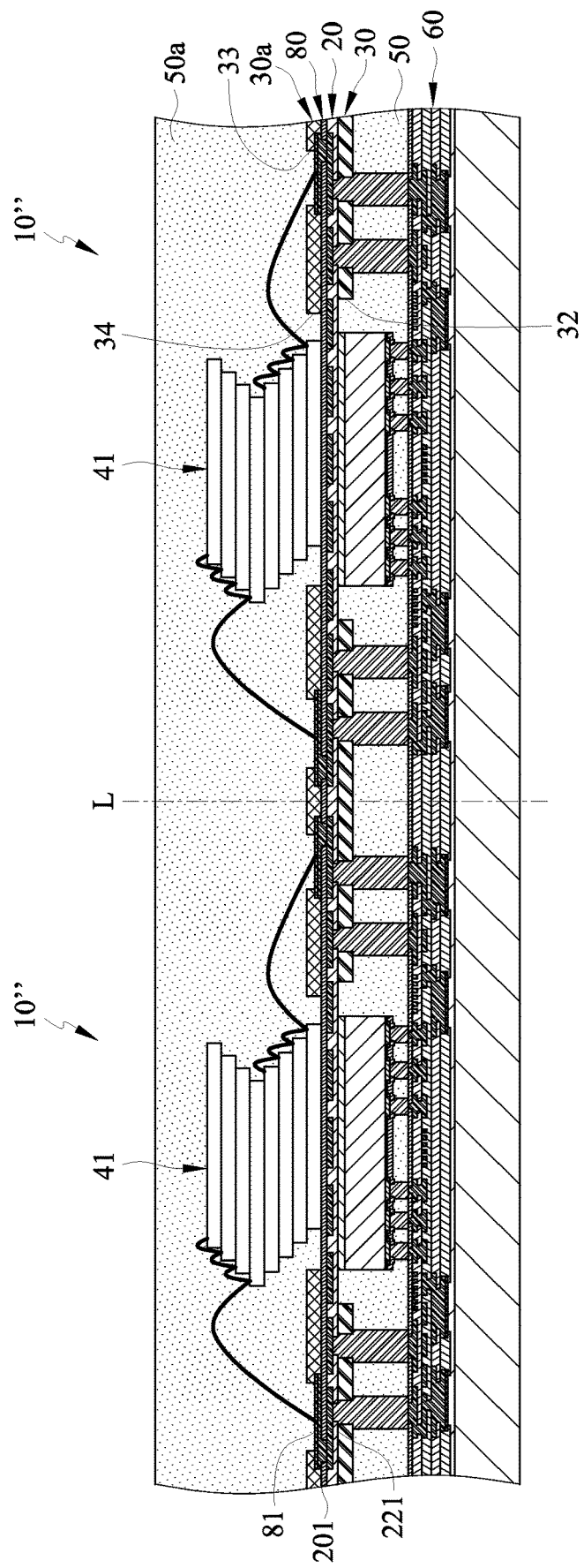
Figure 6:
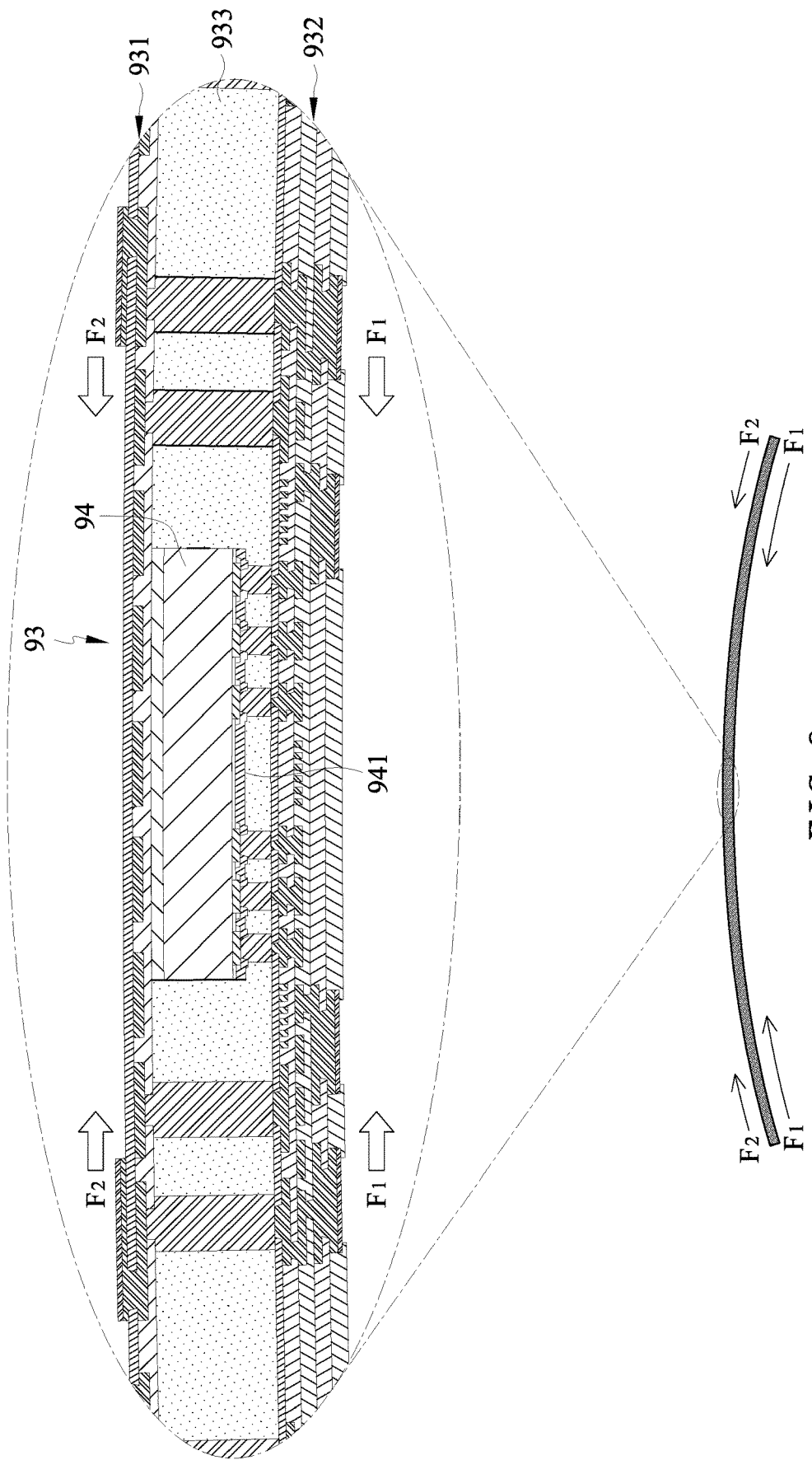
FIG. 6 is a cross sectional view of a conventional chip-middle type FOPLP in accordance with the prior art.
Figure 7:
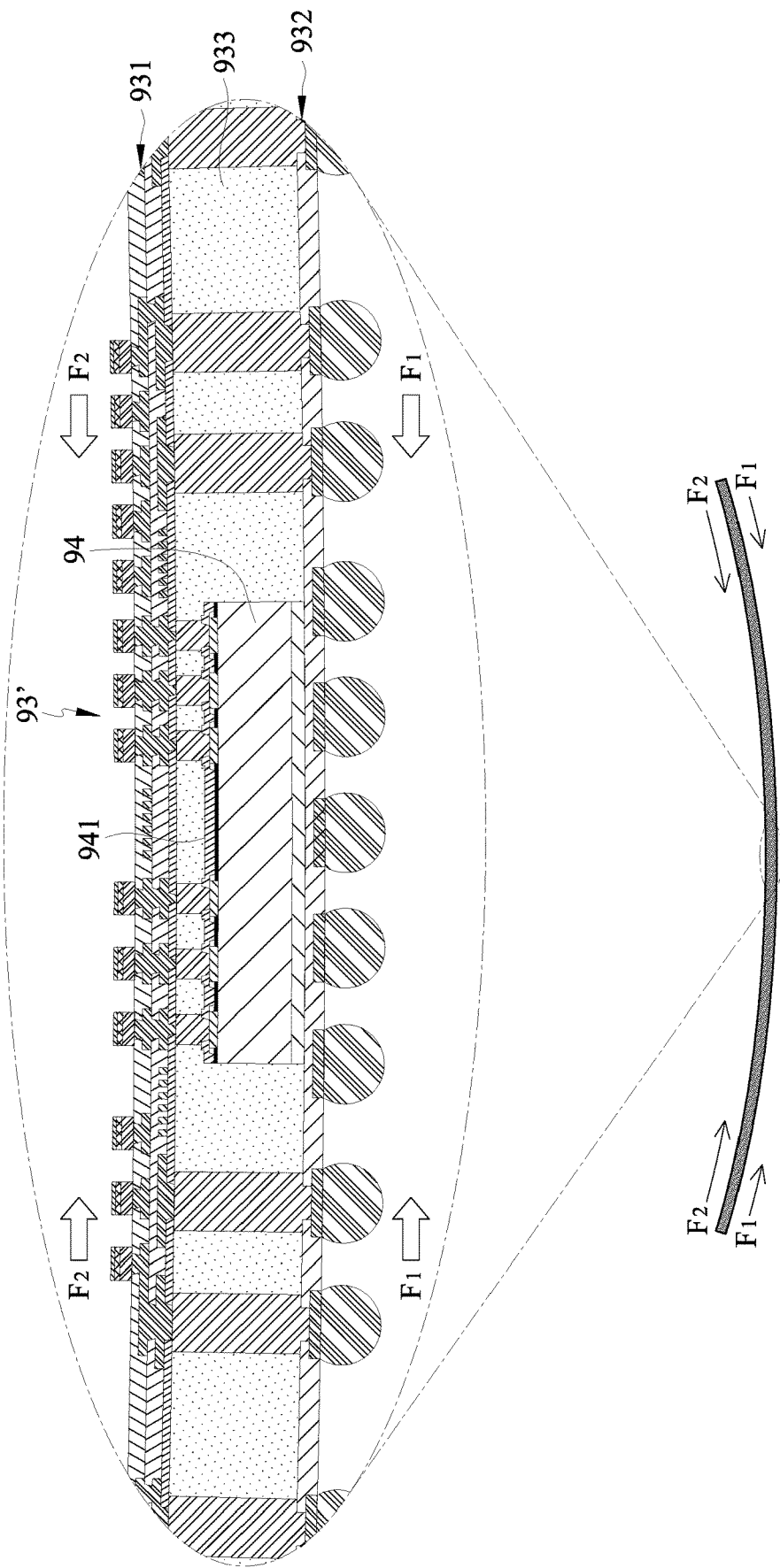
FIG. 7 is a cross-sectional view of another conventional chip-middle type FOPLP in accordance with the prior art.

In the step (k), as shown in FIG. 5J, a plurality of chip stacks 41 are respectively mounted on the third routing layer 80 through the second chip openings 34 of the second PI layer 30a. Each chip stack 41 is wired to the corresponding wiring pads 81 of the third routing layer 80 through the pad openings 33.

In the step (l), as shown in FIG. 5J, a second molding compound layer 50a is formed on the second PI layer 30a to encapsulate the chip stacks 41.

In the step (m), as shown in FIG. 5J, a dicing step is executed along scribe lines L to separate a plurality of chip-middle type FOPLPs 10" of FIG. 3.

Based on foregoing description, the first PI layer is formed on the first routing layer before the chips are mounted thereon, so the first PI layer is formed inside the FOPLP to control the warpage of the FOPLP. Furthermore, since the chips are still directly mounted on the first routing layer through the chip openings of the first PI layer, a height of the FOPLP is not increased when the first PI layer is added.

Even though numerous characteristics and advantages of the present invention have been set forth in the foregoing description, together with the details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A chip-middle type fan-out panel-level package, comprising:
    a first routing layer;
    a first polyimide (PI) layer formed on the first routing layer and having:
        a first chip opening; and
        a plurality of pillar openings;
    a plurality of metal pillars formed on the first routing layer, each through a respective pillar opening;
    a chip mounted on the first routing layer through the first chip opening and having:
        an active surface;
        a rear surface opposite to the active surface;
        a plurality of metal bumps formed on the active surface; and
        an adhesive film formed between the rear surface and the first routing layer;

a first molding compound formed on the first PI layer to encapsulate the metal pillars and the chip; and a second routing layer formed on the first molding compound and electrically connected to the metal pillars and the metal bumps of the chip, wherein a layer count of the second routing layer is larger than that the first routing layer.

2. The fan-out panel-level package as claimed in claim 1, wherein each metal pillar has:

a protruding end having a first diameter, wherein the first diameter matches that of the corresponding pillar opening of the first PI layer; and a flat end having a second diameter, wherein the second diameter is larger than the first diameter.

3. The fan-out panel-level package as claimed in claim 1, wherein the chip is smaller than the corresponding first chip opening; and a gap is positioned between each chip and the first chip opening corresponding to the chip and filled by the first molding compound.

4. The fan-out panel-level package as claimed in claim 1, wherein the first routing layer has:

a metal layer having a plurality of metal pads; and a polyimide lamination formed between the metal layer and the first PI layer, wherein each metal pad is exposed from the polyimide lamination.

5. The fan-out panel-level package as claimed in claim 4 further comprising a plurality of solder balls respectively mounted on the metal pads.

6. The fan-out panel-level package as claimed in claim 5 further comprising a second polyimide (PI) layer formed on the first routing layer to partially cover each metal pad, wherein a thickness of the second PI layer is less than a height of each solder ball.

7. The fan-out panel-level package as claimed in claim 4 further comprising:

a third routing layer formed on the first routing layer and electrically connected the metal pads of the first routing layer, wherein the third routing layer has a plurality of wiring pads;

a second polyimide (PI) layer formed on the third routing layer and has:

a plurality of pad openings corresponding to the wiring pads; and a second chip opening;

a chip stack mounted on the third routing layer through the second chip opening and wired to the metal pads of the third routing layer through the pad openings; and a second molding compound layer formed on the second PI layer to encapsulate the chip stack.

\* \* \* \* \*